US012739986B2

(12) United States Patent
Zhang et al.

(10) Patent No.: US 12,739,986 B2
(45) Date of Patent: Sep. 15, 2026

(54) ELECTRONIC DEVICE HAVING FLEXIBLE DISPLAY SCREEN

(71) Applicant: VIVO MOBILE COMMUNICATION CO., LTD., Dongguan (CN)

(72) Inventors: Jie Zhang, Dongguan (CN); Haiyang Zhang, Dongguan (CN)

(73) Assignee: VIVO MOBILE COMMUNICATION CO., LTD., Dongguan (CN)

(*) Notice: Subject to any disclaimer, the term of this patent is extended or adjusted under 35 U.S.C. 154(b) by 134 days.

(21) Appl. No.: 18/757,431

(22) Filed: Jun. 27, 2024

(65) Prior Publication Data

US 2024/0357756 A1 Oct. 24, 2024

Related U.S. Application Data

(63) Continuation of application No. PCT/CN2022/142662, filed on Dec. 28, 2022.

(30) Foreign Application Priority Data

Dec. 29, 2021 (CN) ........................ 202111649283.9

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS 11,194,366 B2 * 12/2021 Cheng .................. G06F 1/1626
2018/0309861 A1 * 10/2018 Lin ...................... H04M 1/021
(Continued)

FOREIGN PATENT DOCUMENTS

CN 107690010 A * 2/2018 .......... H04M 1/0262
CN 108055371 A 5/2018
(Continued)

OTHER PUBLICATIONS

International Search Report and Written Opinion issued in corresponding International Application No. PCT/CN2022/142662, mailed Mar. 22, 2023, 8 pages.
(Continued)

*Primary Examiner* — Allen L Parker
*Assistant Examiner* — Christopher L Augustin
(74) *Attorney, Agent, or Firm* — IPX PLLC

(57) ABSTRACT

An electronic device is provided. The electronic device includes a first device body, a second device body, a flexible display screen, a shaft component, and a connecting rod mechanism. The first device body is rotatably connected to the second device body via the shaft component. The connecting rod mechanism is connected to the first device body and the shaft component, respectively. The flexible display screen includes a first display screen on the first device body, a second display screen on the second device body, and a third display screen connected to the first display screen and the second display screen. In a folding process of the electronic device, the shaft component drives the first device body to approach the shaft component via the connecting rod mechanism. In an unfolding process of the electronic device, the shaft component drives the first device body to move away from the shaft component.

11 Claims, 9 Drawing Sheets

(56) References Cited

U.S. PATENT DOCUMENTS

| | | | | |
|---|---|---|---|---|
| 2020/0341509 | A1* | 10/2020 | Wu | H04M 1/0268 |
| 2021/0059059 | A1* | 2/2021 | Pai | G06F 1/1681 |
| 2021/0365078 | A1 | 11/2021 | Chen et al. | |

FOREIGN PATENT DOCUMENTS

| | | | |
|---|---|---|---|
| CN | 111147637 | A | 5/2020 |
| CN | 111240413 | A | 6/2020 |
| CN | 111414049 | A | 7/2020 |
| CN | 113194174 | A | 7/2021 |
| CN | 113225412 | A | 8/2021 |
| CN | 114244937 | A | 3/2022 |
| DE | 102017128456 | A1 | 2/2018 |
| WO | 2021184654 | A1 | 9/2021 |

OTHER PUBLICATIONS

First Office Action issued in related Chinese Application No. 202111649283.9, mailed Oct. 13, 2023, 5 pages.

Supplemental Search Report issued in related Chinese Application No. 202111649283.9, mailed Feb. 6, 2024, 3 pages.

* cited by examiner

ELECTRONIC DEVICE HAVING FLEXIBLE DISPLAY SCREEN

CROSS-REFERENCE TO RELATED APPLICATIONS

This application is a continuation of International Application No. PCT/CN2022/142662, filed on Dec. 28, 2022, which claims priority to Chinese Patent Application No. 202111649283.9, filed on Dec. 29, 2021. The entire contents of each of the above-referenced applications are expressly incorporated herein by reference.

TECHNICAL FIELD

This application pertains to the technical field of communication device, and specifically relates to an electronic device.

BACKGROUND

With development of technologies, development of electronic devices is increasingly rapid, and users' requirements on the electronic devices are increasingly high. Currently, a flexible display screen is also widely used in the electronic device, and a foldable electronic device is thereby formed.

A folding problem often occurs in a folding process of the foldable electronic device. For example, when the foldable electronic device is folded inward, a bending radius at a hinge is small, which tends to cause a crease or breakage of the flexible display screen due to excessive squeezing. When the foldable electronic device is folded outward, the bending radius at the hinge is excessively large, which tends to cause the flexible display screen to be excessively pulled and deformed, and may even cause the flexible display screen to be broken. It can be learned that the flexible display screen is prone to damage in the folding process of the foldable electronic device, which results in a short service life of the flexible display screen.

SUMMARY

An objective of embodiments of this application is to provide an electronic device.

This application is implemented as follows.

An electronic device includes a first device body, a second device body, a flexible display screen, a shaft component, and a connecting rod mechanism.

The first device body is rotatably connected to the second device body via the shaft component.

The connecting rod mechanism is connected to the first device body and the shaft component, respectively.

The flexible display screen includes a first display screen, a second display screen, and a third display screen. The first display screen is provided on the first device body. The second display screen is provided on the second device body. The first display screen is connected to the second display screen via the third display screen.

In a folding process of the electronic device, the shaft component drives the first device body to approach the shaft component via the connecting rod mechanism.

In an unfolding process of the electronic device, the shaft component drives the first device body to move away from the shaft component via the connecting rod mechanism.

DETAILED DESCRIPTION

Figure 1:
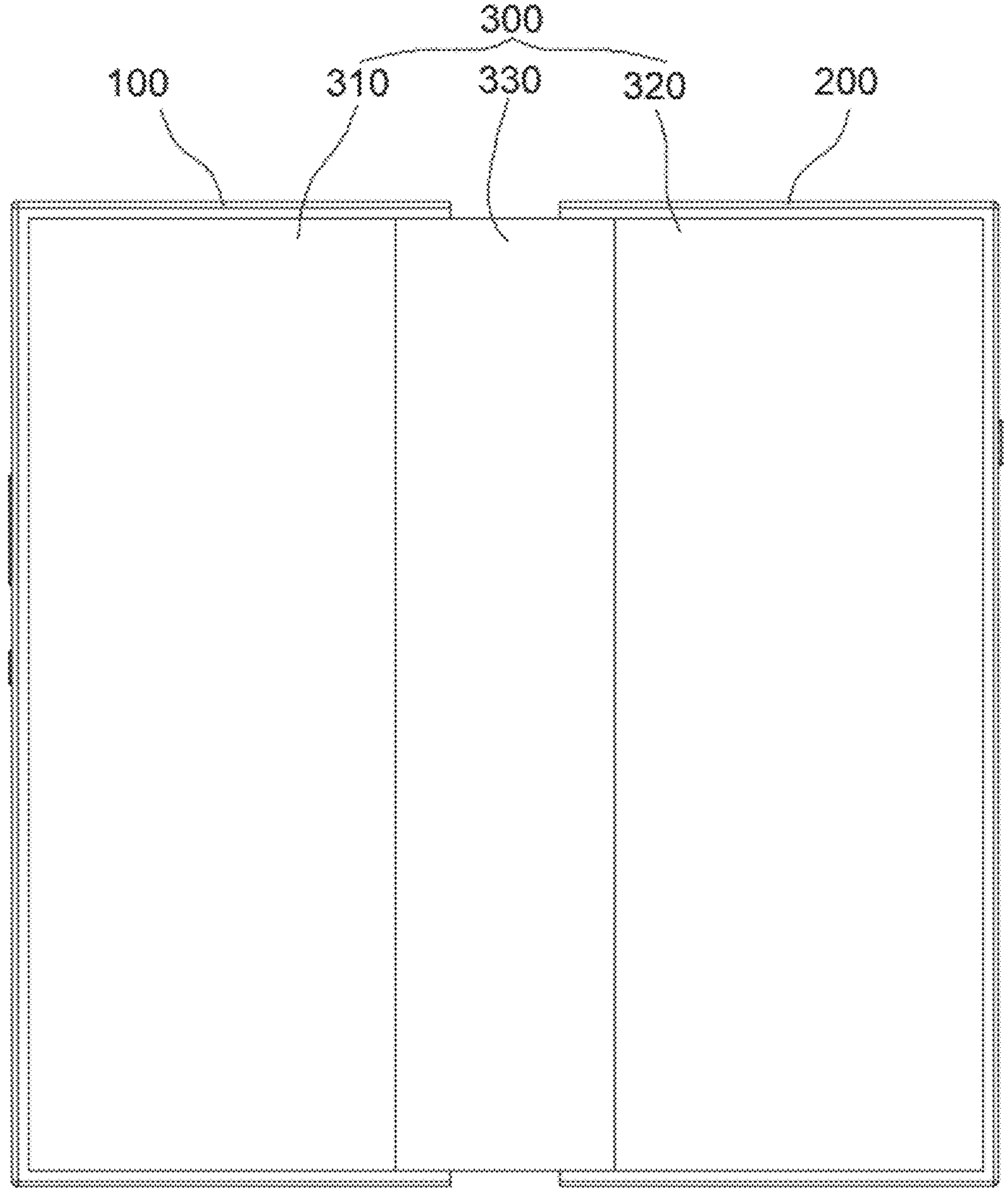
FIG. 1 is a schematic diagram of a first angle of view of an unfolded electronic device disclosed in an embodiment of the present disclosure.

The following clearly describes technical solutions in embodiments of this application with reference to accompanying drawings in the embodiments of this application. Apparently, the described embodiments are some but not all of the embodiments of this application. All other embodiments obtained by a person of ordinary skill in the art based on the embodiments of this application shall fall within the protection scope of this application.

The terms "first", "second", and the like in this specification and claims of this application are used to distinguish between similar objects instead of describing a specific order or sequence. It should be understood that data used in such a way are interchangeable in proper circumstances, so that the embodiments of this application can be implemented in an order other than the order illustrated or described herein. Objects classified by "first", "second", and the like are usually of a same type, and the number of objects is not limited. For example, there may be one or more first objects. In addition, in this specification and the claims, "and/or" represents at least one of connected objects, and a character "/" generally represents an "or" relationship between associated objects.

With reference to FIG. 1 to FIG. 10, an electronic device provided in embodiments of the present disclosure is described in detail by using embodiments and application scenarios of the embodiments.

Referring to FIG. 1 to FIG. 5. The electronic device includes a first device body 100, a second device body 200, a flexible display screen 300, a shaft component 400, and a connecting rod mechanism 500. The first device body 100 and the second device body 200 are basic structural components, and may provide a mounting basis for the flexible display screen 300, the shaft component 400, or another element in the electronic device. For example, the another element of the electronic device may be a battery, a circuit board, or the like. It should be noted that the element in the electronic device is related to a type or use of the electronic device. Therefore, a type and a quantity of specific elements in the electronic device are not limited in this embodiment of this application.

Referring to FIG. 1 to FIG. 5. The first device body 100 is rotatably connected to the second device body 200 via the shaft component 400. The connecting rod mechanism 500 is connected to the first device body 100 and the shaft component 400, respectively. The flexible display screen 300 includes a first display screen 310, a second display screen 320, and a third display screen 330. The first display screen 310 is provided on the first device body 100. The second display screen is provided on the second device body 200. The first display screen 310 is connected to the second display screen 320 via the third display screen 330.

The first device body 100 is rotatably matched with the second device body 200 via the shaft component 400, so that the electronic device may implement folding and unfolding through the relative rotation between the first device body 100 and the second device body 200.

In an embodiment, an angle between the first device body 100 and the second device body 200 ranges from a first angle and a second angle. When the angle between the first device body 100 and the second device body 200 is the first angle, display surfaces of the flexible display screen 300 are on a same plane, that is, the electronic device is in an unfolded state. When the angle between the first device body 100 and the second device body 200 is the second angle, the first device body 100 and the second device body 200 are mutually folded, that is, the electronic device is in a folded state. For example, the first device body 100 and the second device body 200 may rotate between 0° and 180°.

In an embodiment, the flexible display screen 300 of the electronic device is of an out-folding type. When the electronic device is in the folded state, the display surface of the flexible display screen 300 is externally located. For example, when the angle between the first device body 100 and the second device body 200 is the second angle, a side that is of the first device body 100 and that is away from the flexible display screen 300 is superposed on a side that is of the second device body 200 and that is away from the flexible display screen 300. That is, when the electronic device is in the folded state, the first display screen 310 is located on a side that is of the first device body 100 and that faces away from the second device body 200, and the second display screen 320 is located on a side that is of the second device body 200 and that faces away from the first device body 100. It should be noted that the display surface of the flexible display screen 300 refers to a surface that is of the flexible display screen 300 and on which an image or a text may be displayed.

Referring to FIG. 2 to FIG. 5. The first display screen 310 is connected to the first device body 100, so that the first display screen 310 may move with the first device body 100 in a direction closer to the shaft component 400.

For example, in a folding process of the electronic device, the shaft component 400 drives the first device body 100 to approach the shaft component 400 via the connecting rod mechanism 500, so that the first display screen 310 may move in the direction closer to the shaft component 400. In an unfolding process of the electronic device, the shaft component 400 drives the first device body 100 to move away from the shaft component 400 via the connecting rod mechanism 500, so that the first display screen 310 may move in a direction away from the shaft component 400.

It should be noted that the first device body 100 moves in the direction closer to the shaft component 400 means that the first device body 100 approaches the shaft component 400 in a direction in which the first device body 100 extends toward the shaft component 400. That the first device body 100 moves in the direction away from the shaft component 400 means that the first device body 100 moves away from the shaft component 400 in a direction in which the first device body 100 extends away from the shaft component 400.

In the foregoing embodiment, the flexible display screen 300 is divided into three parts: the first display screen 310, the second display screen 320, and the third display screen 330. The first display screen 310 is provided on the first device body 100, and the second display screen 320 is provided on the second device body 200. A first end of the third display screen 330 is connected to the first display screen 310. A second end of the third display screen 330 is connected to the second display screen 320. At least a part of the third display screen 330 is opposite to the shaft component 400.

In the folding process of the electronic device, the first display screen 310 moves in the direction closer to the shaft component 400, to push the first end of the third display screen 330 to approach the second end of the third display screen 330, so that the third display screen 330 may form redundancy, to adapt to deformation of the shaft component 400 in the folding process of the electronic device, eliminate or reduce an extrusion force on a part that is of the flexible display screen 300 and that is opposite to the shaft component 400, thereby protecting the flexible display screen 300.

In the unfolding process of the electronic device, the first display screen 310 moves in the direction away from the shaft component 400, to pull the first end of the third display screen 330 away from the second end of the third display screen 330, so that the redundancy formed by the third display screen 330 is stretched, to adapt to deformation of the shaft component 400 in the unfolding process of the electronic device, eliminate or reduce a pulling force on the part that is of the flexible display screen 300 and that is opposite to the shaft component 400, thereby protecting the flexible display screen 300.

In an embodiment, in the folding process of the electronic device, the first end and the second end of the third display screen 330 may be acted on, so that the third display screen 330 forms the redundancy. In an embodiment, the first end of the third display screen 330 is acted on to move in a direction closer to the second end of the third display screen 330, so that the first end of the third display screen 330 and the second end of the third display screen 330 approach each other to form the redundancy. In another embodiment, the second end of the third display screen 330 is acted on to move in a direction closer to the first end of the third display screen 330, so that the first end of the third display screen 330 and the second end of the third display screen 330 approach each other to form the redundancy. The two ends of the third display screen 330 may be acted on, so that the first end of the third display screen 330 and the second end of the third display screen 330 approach each other to form the redundancy.

Similarly, in the unfolding process of the electronic device, at least one of the first end and the second end of the third display screen 330 may be acted on to move, so that the first end of the third display screen 330 and the second end of the third display screen 330 move away from each other, to eliminate the redundancy formed by the third display screen 330.

In an embodiment, both the first device body 100 and the second device body 200 may be moved away from or closer to the shaft component 400. Further, there are at least two connecting rod mechanisms 500, including at least one connecting rod mechanism 500 connected to the first device body 100 and the shaft component 400 and at least one connecting rod mechanism 500 connected to the second device body 200 and the shaft component 400. In the folding process of the electronic device, the shaft component 400 drives the first device body 100 and/or the second device body 200 to approach the shaft component 400 via the connecting rod mechanism 500. In the unfolding process of the electronic device, the shaft component 400 drives the first device body 100 and/or the second device body 200 to move away from the shaft component 400 via the connecting rod mechanism 500.

Referring to FIG. 2 to FIG. 6. The connecting rod mechanism 500 includes a sliding member 510 and a first connecting rod 520. The sliding member 510 is connected to the shaft component 400. A first end of the first connecting rod 520 is connected to the sliding member 510. A second end of the first connecting rod 520 is connected to the first device body 100. In the folding process of the electronic device, the shaft component 400 may drive the sliding member 510 to move along the shaft component 400, and the sliding member 510 drives the first device body 100 to approach the shaft component 400 via the first connecting rod 520. In the unfolding process of an electronic device, the shaft component 400 may drive the sliding member 510 to move along the shaft component 400, and the sliding member 510 drives the first device body 100 to move away from the shaft component 400 via the first connecting rod 520.

Figure 2:
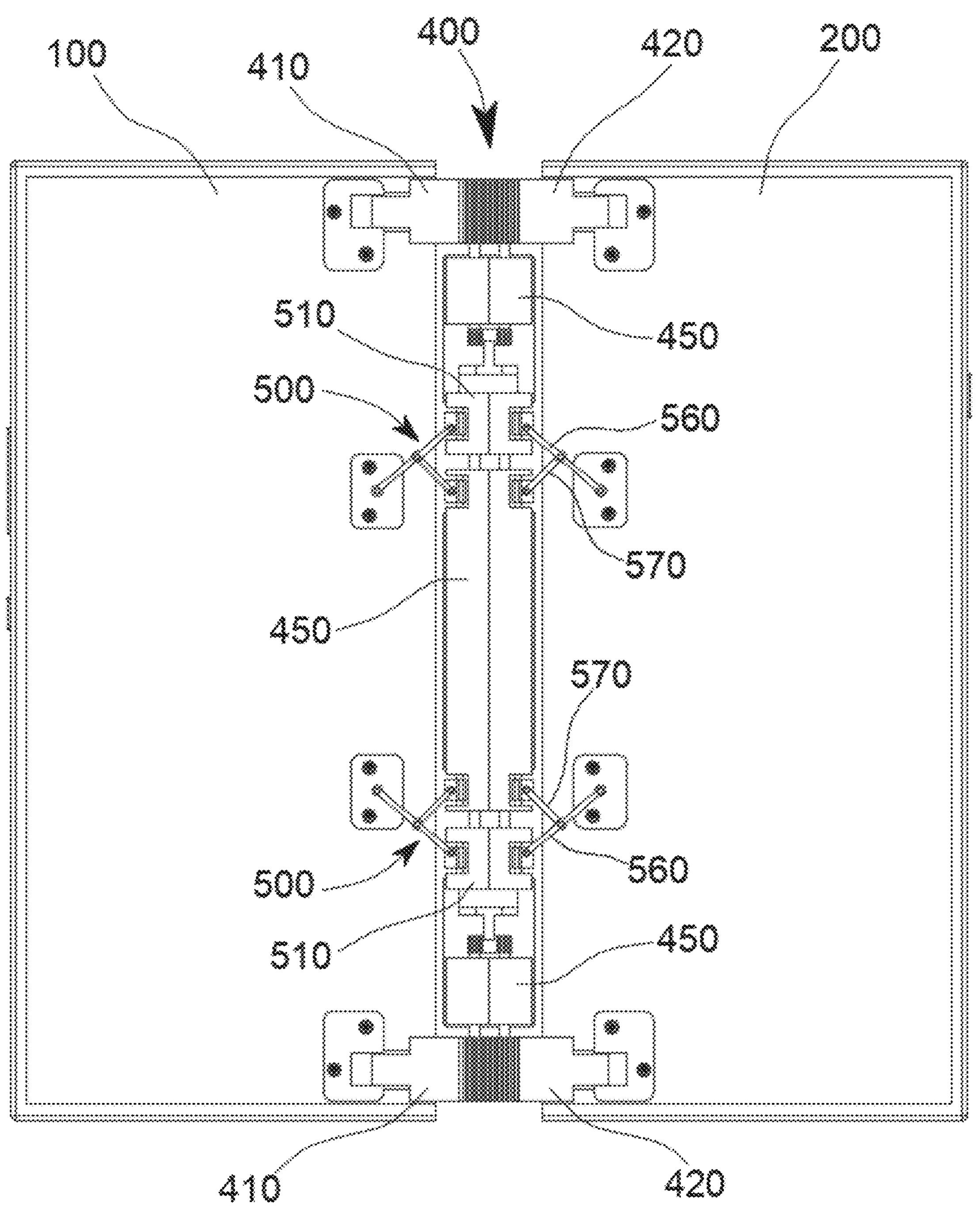
FIG. 2 is a schematic diagram of a second angle of view of an unfolded electronic device disclosed in an embodiment of the present disclosure.
Figure 3:
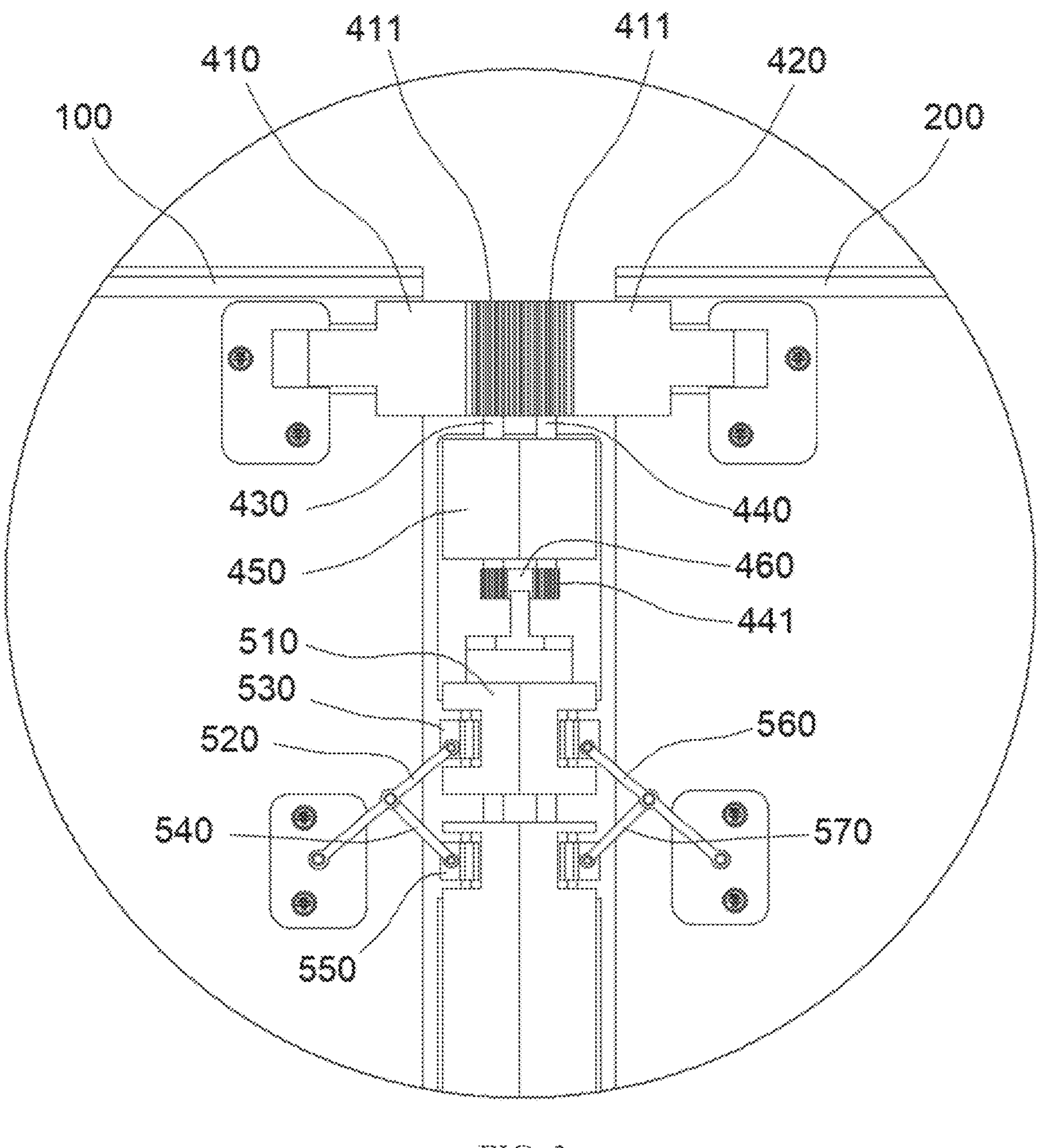
FIG. 3 is a partially enlarged view of FIG. 2.

In FIG. 2 to FIG. 5, the shaft component 400 may drive the sliding member 510 to move along the shaft component 400, to further drive the first connecting rod 520 to rotate relative to the first device body 100. Referring to FIG. 3, in a process in which the first connecting rod 520 rotates relative to the first device body 100, an angle between the first connecting rod 520 and an axial direction of the shaft component 400 increases or decreases, so that the first device body 100 may be further pulled to move in the direction closer to or away from the shaft component 400.

It should be noted that the angle between the first connecting rod 520 and the axial direction of the shaft component 400 in the embodiments of the present disclosure refers to an angle less than or equal to 90° formed between the first connecting rod 520 and an axial direction corresponding to a rotating shaft of the shaft component 400.

For example, in the folding process of the electronic device, the sliding member 510 drives the first end of the first connecting rod 520 to move relative to the shaft component 400, so that the angle between the first connecting rod 520 and the axial direction of the shaft component 400 decreases. As the angle between the first connecting rod 520 and the axial direction of the shaft component 400 decreases, the first connecting rod 520 drives the first device body 100 to move in the direction closer to the shaft component 400, so that the third display screen 330 can form the redundancy, to prevent the flexible display screen 300 from being pulled during the folding process of the electronic device. In the unfolding process of the electronic device, the sliding member 510 drives the first end of the first connecting rod 520 to move relative to the shaft component 400, so that the angle between the first connecting rod 520 and the axial direction of the shaft component 400 increases. As the angle between the first connecting rod 520 and the axial direction of the shaft component 400 increases, the first connecting rod 520 drives the first device body 100 to move in the direction away from the shaft component 400, so that the redundancy formed by the third display screen 330 is eliminated, to avoid warping of the flexible display screen 300.

There are many connection manners in which the shaft component 400 drives the sliding member 510, for example, a thread engagement, a gear-rack transmission connection, and cam mechanism connection. Therefore, a specific connection manner between the shaft component 400 and the sliding member 510 is not limited in the embodiments of the present disclosure.

Referring to FIG. 2 and FIG. 3. The shaft component 400 includes a first connecting member 410, a first rotating shaft 430, and a second rotating shaft 440. The first rotating shaft 430 and the second rotating shaft 440 are disposed in parallel. In some embodiments, the first connecting member 410 is connected to the first rotating shaft 430, and the first connecting member 410 may drive the first rotating shaft 430 to rotate. The first device body 100 is slidably matched with the first connecting member 410, and the first device body 100 may approach or move away from the first rotating shaft 430 along the first connecting member 410. Further, the second device body 200 is connected to the second rotating shaft 440.

In an embodiment, the first connecting member 410 may be fixedly connected to the first rotating shaft 430, so that the first connecting member 410 may drive the first rotating shaft 430 to rotate. The first connecting member 410 may be detachably connected to the first rotating shaft 430, and the first rotating shaft 430 and the first connecting member 410 are rotatably limited. For example, one of the first rotating shaft 430 and the first connecting member 410 is provided with a limiting slot, and the other is provided with a limiting protrusion. The limiting protrusion is at least partially located in the limiting slot, so that the first connecting member 410 can drive the first rotating shaft 430 to rotate. Therefore, a connection manner between the first device body 100 and the first rotating shaft 430 is not limited in this embodiment.

In the foregoing embodiment, the first rotating shaft 430 and the second rotating shaft 440 are disposed in parallel, that is, the first device body 100 and the second device body 200 rotate respectively around two parallel axes, so that space for mutual avoidance between the first device body 100 and the second device body 200 increases, to avoid mutual interference between the first device body 100 and the second device body 200 in the unfolding or folding process of the electronic device. Further, a spacing between the first rotating shaft 430 and the second rotating shaft 440 may be adjusted based on thicknesses of the first device body 100 and the second device body 200. For example, a larger spacing between the first rotating shaft 430 and the second rotating shaft 440 leads to larger space that is for mutual avoidance between the first device body 100 and the second device body 200 and that is formed at the shaft component 400. Further, the spacing between the first rotating shaft 430 and the second rotating shaft 440 needs to be selected based on the thicknesses of the first device body 100 and the second device body 200. Therefore, the spacing between the first rotating shaft 430 and the second rotating shaft 440 is not limited in this embodiment.

In an embodiment, the first connecting member 410 is perpendicularly connected to the first rotating shaft 430. Further, there may be a plurality of first connecting members 410, and the plurality of first connecting members 410 are distributed along an axial direction of the first rotating shaft 430.

Figure 5:
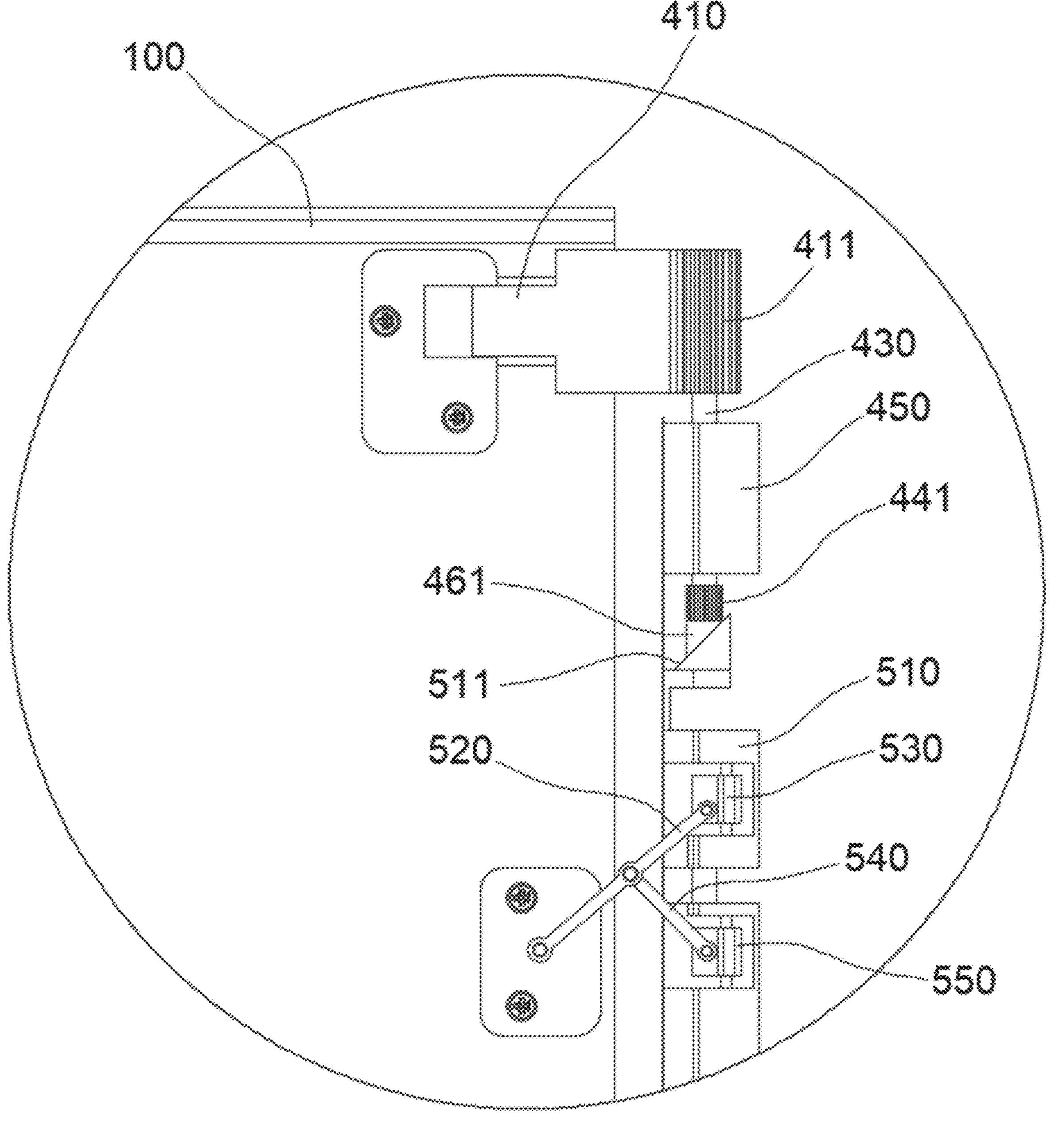
FIG. 5 is a partially enlarged view of FIG. 4.
Figure 6:
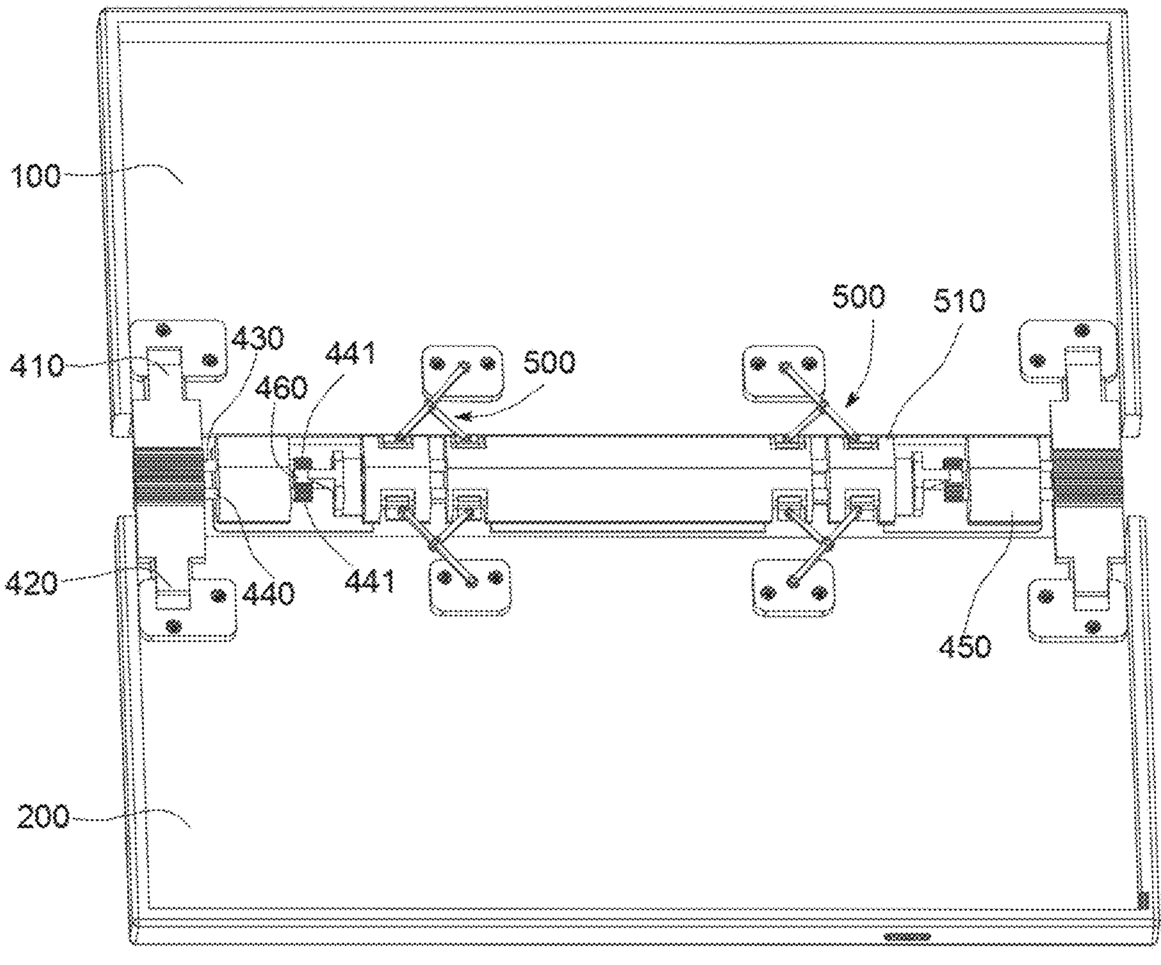
FIG. 6 is a schematic diagram of a third angle of view of an unfolded electronic device disclosed in an embodiment of the present disclosure.

Referring to FIG. 3 and FIG. 5. The shaft component 400 further includes a second connecting member 420, and the second device body 200 is connected to the second rotating shaft 440 via the second connecting member 420. The first connecting member 410 and the second connecting member 420 are both disposed with first gears 411. The first gear 411 on the first connecting member 410 and the first gear 411 on the second connecting member 420 are engaged with each other, so that the first device body 100 and the second device body 200 rotate synchronously relative to the shaft component 400. In some embodiments, the first gear 411 may be an arc-shaped tooth section disposed on the first connecting member 410 and the second connecting member 420.

In the foregoing embodiment, the first connecting member 410 and the second connecting member 420 are engaged with each other through the first gears 411, so that a rotation angle of the first device body 100 relative to the shaft component 400 is equal to a rotation angle of the second device body 200 relative to the shaft component 400, which can ensure that redundancy formation of the third display screen 330 is controllable, and facilitates protecting the flexible display screen 300.

Referring to FIG. 2 to FIG. 6. The shaft component 400 further includes a bracket 450. The bracket 450 is provided with a first mounting hole and a second mounting hole. The first rotating shaft 430 is rotatably matched with the first mounting hole. The second rotating shaft 440 is rotatably matched with the second mounting hole. For example, the first mounting hole and the second mounting hole are provided in parallel. The first rotating shaft 430 passes through the first mounting hole and is rotatably matched with the first mounting hole. The second rotating shaft 440 passes through the second mounting hole and is rotatably matched with the second mounting hole. This embodiment may provide a mounting basis for the first rotating shaft 430 and the second rotating shaft 440 via the bracket 450, and limit the spacing between the first rotating shaft 430 and the second rotating shaft 440 via the bracket 450.

For example, there may be a plurality of brackets 450, and the plurality of brackets 450 may be disposed along the axial direction of the first rotating shaft 430 and/or an axial direction of the second rotating shaft 440.

In an embodiment, an arc-shaped support surface is provided on a side that is of the bracket 450 and that is close to the flexible display screen 300, so that the bracket 450 may be used to support the flexible display screen 300. For example, when the electronic device is in the folded state, the third display screen 330 may be supported on the bracket 450. In addition, the arc-shaped support surface is provided on the side that is of the bracket 450 and that is close to the flexible display screen 300, which can effectively guide deformation of the third display screen 330, to avoid excessive bending of a part of the third display screen 330. Further, the side that is of the bracket 450 and that is close to the flexible display screen 300 is provided as a circular arc-shaped support surface. When the electronic device is in the folded state, curvatures corresponding to parts that are of the flexible display screen 300 and that are supported on the circular arc-shaped support surface are consistent.

In an embodiment, the sliding member 510 may be provided with a third mounting hole and a fourth mounting hole. The first rotating shaft 430 may pass through the third mounting hole and is rotatably matched with the sliding member 510. The second rotating shaft 440 may pass through the fourth mounting hole and is rotatably matched with the sliding member 510, so that the sliding member 510 may provide a mounting base for the first rotating shaft 430 and the second rotating shaft 440, and limit the spacing between the first rotating shaft 430 and the second rotating shaft 440.

Figure 7:
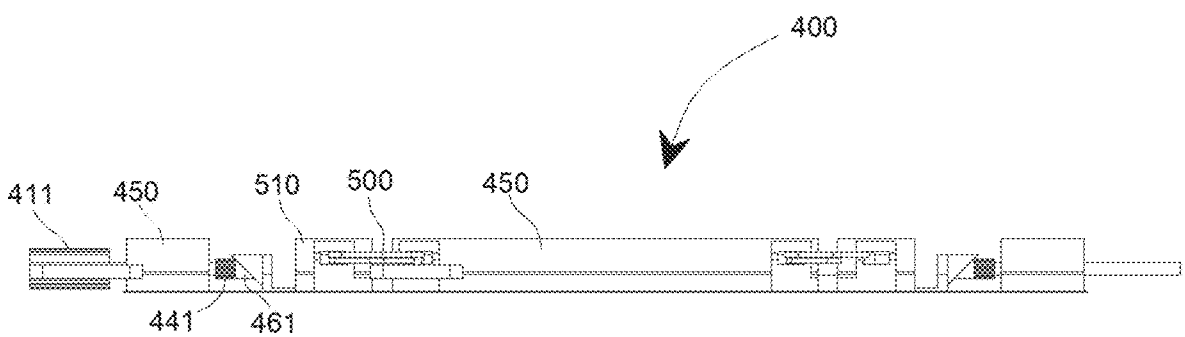
FIG. 7 is a schematic diagram of a first angle of view of a shaft component disclosed in a first embodiment of the present disclosure.
Figure 8:
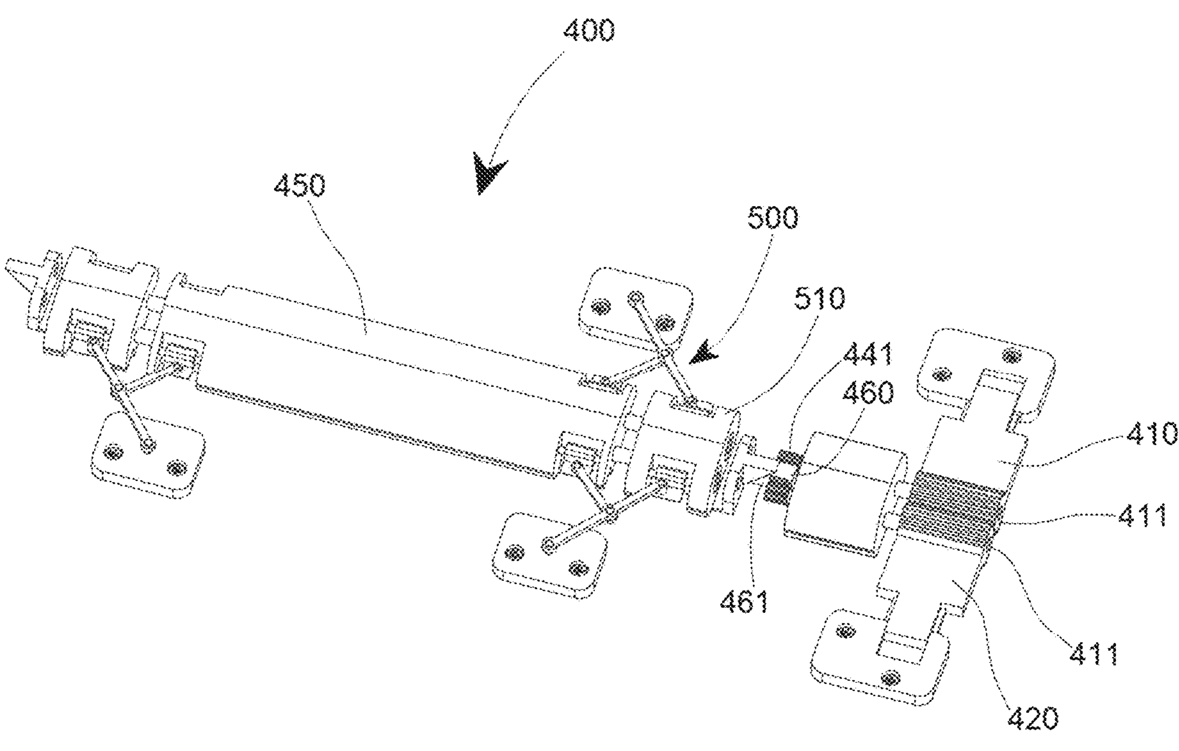
FIG. 8 is a schematic diagram of a second angle of view of a shaft component disclosed in a first embodiment of the present disclosure.

Referring to FIG. 5 and FIG. 7. The shaft component 400 further includes a support plate. The support plate is disposed on the side that is of the bracket 450 and that is close to the flexible display screen 300. An arc-shaped support surface is provided on a side that is of the support plate and that is close to the flexible display screen 300. For example, the support plate may provide a support force for the flexible display screen 300 at a junction between the first device body 100 and the second device body 200, to avoid depression of the flexible display screen 300 at the junction between the first device body 100 and the second device body 200 due to a force. For example, the arc-shaped support surface is provided on the side that is of the support plate and that is close to the flexible display screen 300, and the flexible display screen 300 is at least partially supported on the arc-shaped support surface, so that the flexible display screen 300 can better fit the support plate when the electronic device is in the folded state. The support plate may be fastened to the bracket 450. For example, the support plate may be fastened to the bracket 450 via screws. The support plate may further be integrated with the bracket 450.

In the foregoing embodiment, when the electronic device is in the folded state, the support plate may be used to provide support for the third display screen 330, to avoid depression of the third display screen 330 due to a force. When the electronic device is in the unfolded state, at least a part of the support plate may provide support for the third display screen 330.

Referring to FIG. 2 to FIG. 10. The first end of the first connecting rod 520 is rotatably matched with the sliding member 510. The first connecting rod 520 rotates around a first axis and a second axis relative to the sliding member 510. The first axis is parallel with or overlaps an axis of the first rotating shaft 430 or an axis of the second rotating shaft 440. The second axis is perpendicular to the first axis. The second end of the first connecting rod 520 is rotatably connected to the first device body 100.

Figure 4:
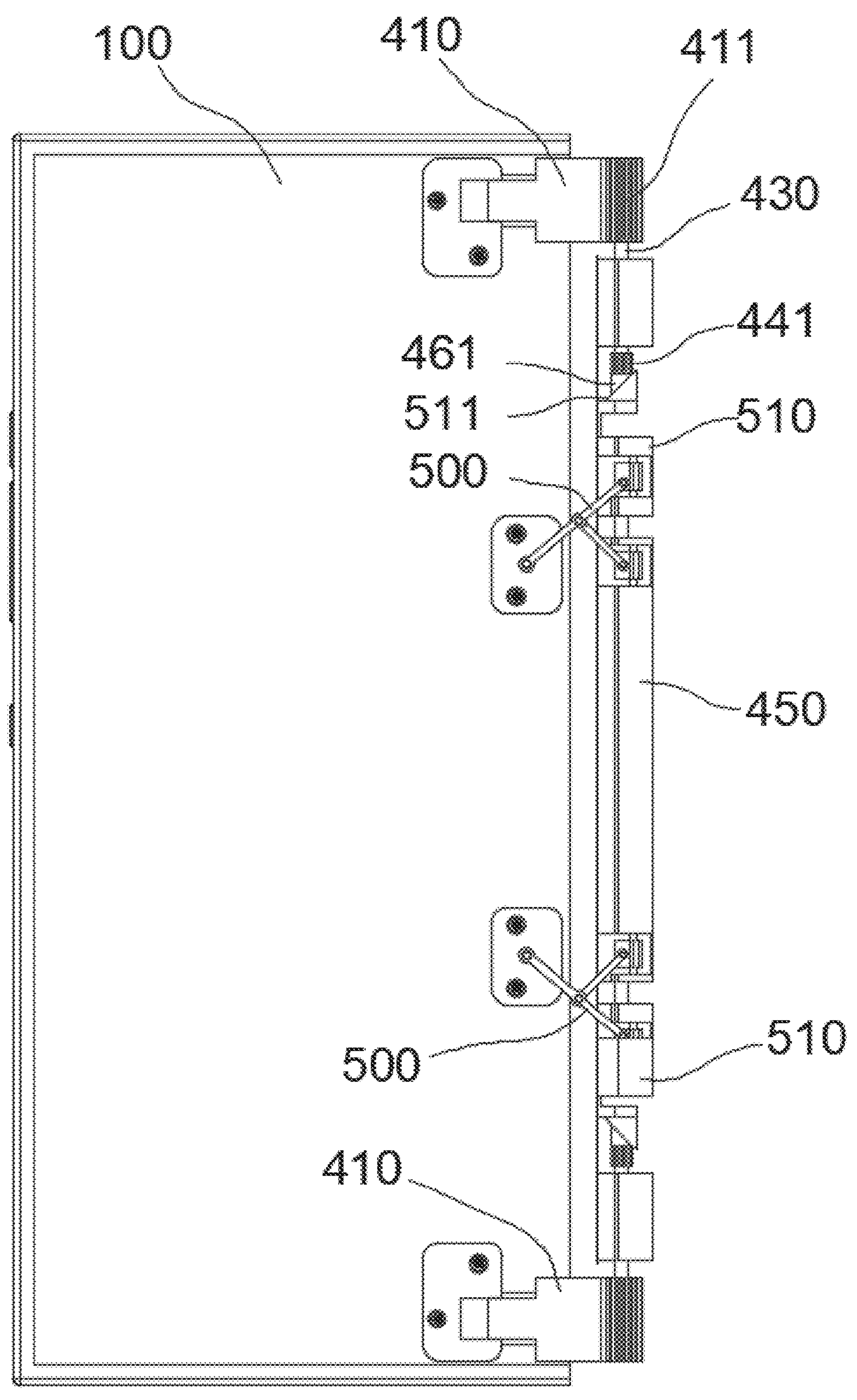
FIG. 4 is a schematic diagram of a first angle of view of a folded electronic device disclosed in an embodiment of the present disclosure.

Referring to FIG. 2 to FIG. 4. In a process in which the sliding member 510 moves along the shaft component 400, the first end of the first connecting rod 520 rotates relative to the sliding member 510, and the second end of the first connecting rod 520 rotates relative to the first device body 100. As a result, the angle between the first connecting rod 520 and the axial direction of the shaft component 400 increases or decreases, so that the first device body 100 may be further pulled to move in the direction closer to or away from the shaft component 400, and the first display screen 310 is further driven to approach or move away from the shaft component 400.

There are many manners in which the first end of the first connecting rod 520 is rotatably matched with the sliding member 510. For example, the first end of the first connecting rod 520 may be connected to the sliding member 510 via a universal joint. There are many types of universal joints, such as a cross-type rigid universal joint, a ball yoke universal joint, a flexible universal joint, and a ball-hinged universal joint. Therefore, a specific manner in which the first end of the first connecting rod 520 is rotatably matched with the sliding member 510 is not limited in this application.

In an embodiment, the connecting rod mechanism 500 further includes a first hinge joint 530. The first hinge joint 530 is rotatably matched with the sliding member 510, and the first hinge joint 530 rotates around the first axis relative to the sliding member 510. The first end of the first connecting rod 520 is rotatably matched with the first hinge joint 530, and the first connecting rod 520 rotates around the second axis relative to the first hinge joint 530. For example, the first hinge joint 530 is matched with the sliding member 510 through a shaft hole, so that the first hinge joint 530 may rotate around the first axis.

Further, an avoidance hole is provided on the sliding member 510. The first hinge joint 530 is rotatably matched with the first rotating shaft 430, so that the first hinge joint 530 may be rotatably matched with the sliding member 510 via the first rotating shaft 430, and the first hinge joint 530 may slide along the first rotating shaft 430. In this embodiment, a range of relative movement between the first device body 100 and the first connecting rod 520 may be reduced, which facilitates reducing the avoidance space that is used for movement of the first connecting rod 520 and that is provided in the first device body 100.

Referring to FIG. 2 to FIG. 10. The connecting rod mechanism 500 further includes a second connecting rod 540. A first end of the second connecting rod 540 is rotatably matched with the bracket 450. The second connecting rod 540 rotates around a third axis and a fourth axis relative to the bracket 450. The third axis is parallel with or overlaps the axis of the first rotating shaft 430. The fourth axis is perpendicular to the third axis. A second end of the second connecting rod 540 is rotatably connected to the first connecting rod 520, and a connection point between the second connecting rod 540 and the first connecting rod 520 is located between the first end and the second end of the first connecting rod 520.

In some embodiments, the third axis overlaps the first axis. Further, a connection manner between the first end of the second connecting rod 540 and the bracket 450 may be the same as a connection manner between the first connecting rod 520 and the sliding member 510. Therefore, this specification does not further describe an embodiment of the connection manner between the first end of the second connecting rod 540 and the bracket 450.

Referring to FIG. 2 to FIG. 10. The connecting rod mechanism 500 further includes a second hinge joint 550. The second hinge joint 550 is rotatably matched with the bracket 450, and the second hinge joint 550 rotates around the third axis relative to the bracket 450. The first end of the second connecting rod 540 is rotatably matched with the second hinge joint 550, and the second connecting rod 540 rotates around the fourth axis relative to the second hinge joint 550.

For example, the second hinge joint 550 is matched with the bracket 450 through a shaft hole, so that the second hinge joint 550 may rotate around the third axis. In some embodiments, an avoidance hole is disposed on the bracket 450, and the second hinge joint 550 is rotatably matched with the first rotating shaft 430, so that the second hinge joint 550 may be rotatably matched with the sliding member 510 via the first rotating shaft 430.

In an embodiment, a length of the first connecting rod 520 is twice a length of the second connecting rod 540, and the second connecting rod 540 is connected to the middle of the first connecting rod 520. In this embodiment, the second end of the first connecting rod 520 may approach or move away from the shaft component 400, and a track of the second end of the first connecting rod 520 is perpendicular to the shaft component 400. In this embodiment, resistance may be reduced when the first device body 100 moves away from or approaches the shaft component 400.

Figure 9:
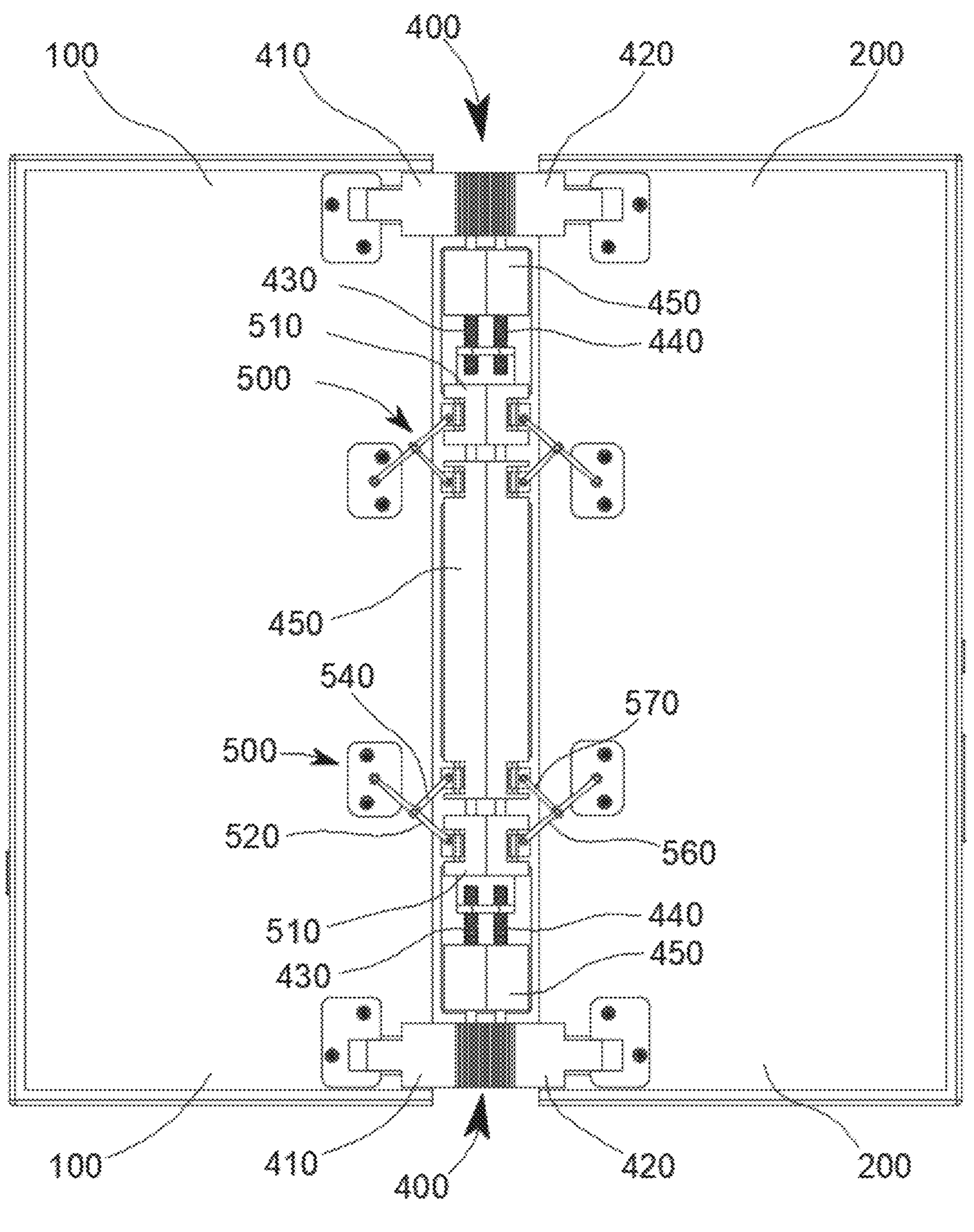
FIG. 9 is a schematic diagram of a fourth angle of view of an unfolded electronic device disclosed in an embodiment of the present disclosure.
Figure 10:
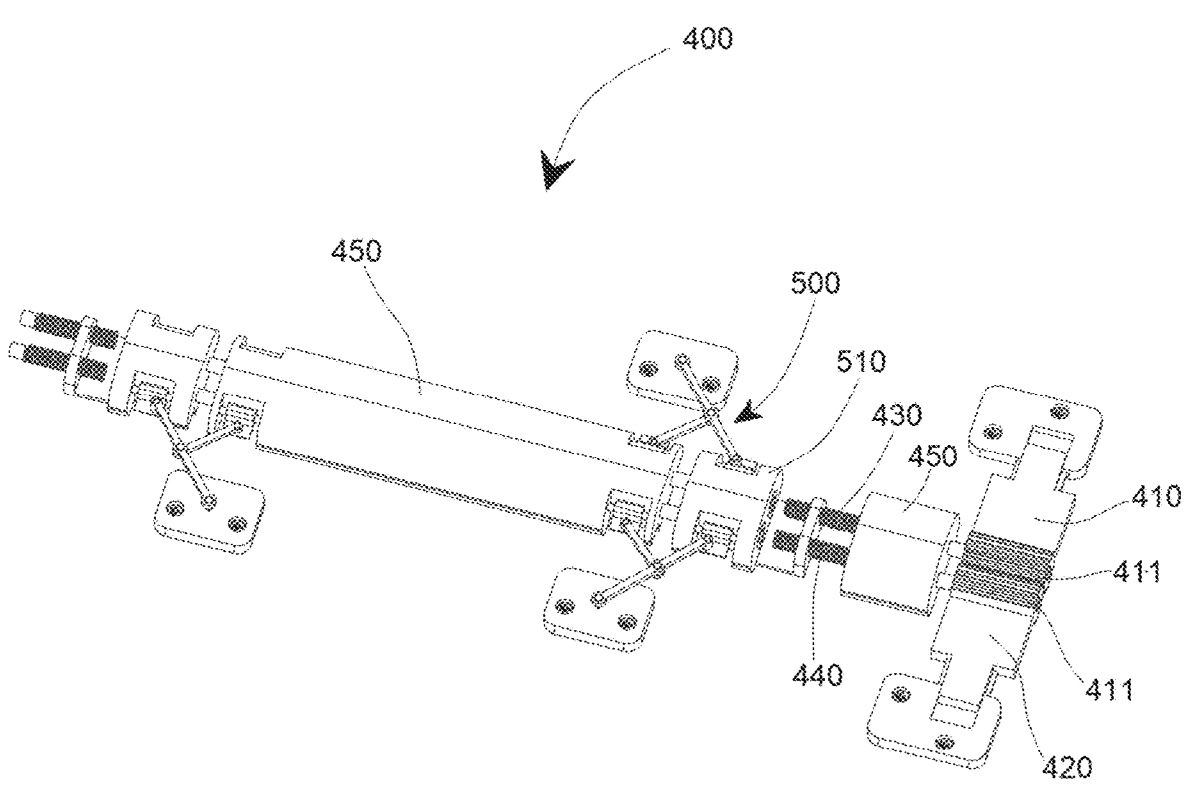
FIG. 10 is a schematic diagram of a first angle of view of a shaft component disclosed in a second embodiment of the present disclosure.

Referring to FIG. 9 and FIG. 10. At least one of the first rotating shaft 430 and the second rotating shaft 440 is provided with a threaded section. The sliding member 510 is provided with a threaded hole. The threaded section and the threaded hole are threadedly matched with the sliding member 510. For example, the sliding member 510 may be provided with the third mounting hole and the fourth mounting hole. The third mounting hole and the fourth mounting hole are both provided as threaded holes, so that the first rotating shaft 430 may pass through the third mounting hole and be threadedly matched with the sliding member 510. The second rotating shaft 440 may pass through the fourth mounting hole and be threadedly matched with the sliding member 510.

For example, in the folding or unfolding process of the electronic device, the first device body 100 drives the first rotating shaft 430 to rotate, so that the first rotating shaft 430 may drive the sliding member 510 to move along the first rotating shaft 430 via the thread engagement, and further drives the first device body 100 to move in the direction closer to or away from the shaft component 400 via the connecting rod mechanism 500. Similarly, in the folding or unfolding process of the electronic device, the second device body 200 may drive the second rotating shaft 440 to rotate, so that the second rotating shaft 440 drives the sliding member 510 to move along the shaft component 400 via the thread engagement, and further drives the first device body 100 to move in the direction closer to or away from the shaft component 400 via the connecting rod mechanism 500. Apparently, either of the first rotating shaft 430 and the second rotating shaft 440 has the threaded section, and the threaded section is threadedly matched with the sliding member 510. The sliding member 510 may move along the shaft component 400 via either of the first rotating shaft 430 and the second rotating shaft 440. The first rotating shaft 430 and the second rotating shaft 440 may both have the threaded sections, and the first rotating shaft 430 and the second rotating shaft 440 are both threadedly matched with the sliding member 510 via the threaded sections.

In an embodiment, a guide rail is disposed on the bracket 450. The sliding member 510 is slidably matched with the guide rail, so that the bracket 450 can slide along the guide rail. In some embodiments, a guide direction of the guide rail is set along the axial direction of the shaft component 400. For example, the guide rail may be the first rotating shaft 430 or the second rotating shaft 440. The guide rail may be a sliding rod independent of the first rotating shaft 430 and the second rotating shaft 440. Further, there may be two guide rails, to prevent the sliding member 510 from being stuck in a process of sliding along the guide rail.

In the foregoing solution, in the folding process of the electronic device, the flexible display screen 300 may not be pulled or pressed, to protect the flexible display screen. In addition, in a using process of the electronic device, the flexible display screen 300 may be subject to forces in various directions, for example, a friction force generated by a finger in a process of sliding on a surface of the flexible display screen 300. In the foregoing embodiment, the first rotating shaft 430 and the sliding member 510 may use the thread engagement to implement limiting of the first device body 100 and the second device body 200. Further, the flexible display screen 300 does not drive the first device body 100 and the second device body 200 to slide in the use process. Therefore, the electronic device described in the foregoing embodiment does not need to add a damping structure that prevents the first device body 100 and/or the second device body 200 from sliding relative to the shaft component 400.

Referring to FIG. 4 to FIG. 8. In another implementation, the shaft component 400 further includes a rack 460. At least one of the first rotating shaft 430 and the second rotating shaft 440 is disposed with a second gear. One of the rack 460 and the sliding member 510 is disposed with a pushing part 461, and the other one of the rack 460 and the sliding member 510 is provided with a guiding surface 511. The guiding surface 511 is provided in an inclined manner relative to the axial direction of the first rotating shaft 430, and the pushing part 461 abuts against the guiding surface 511. In the folding process of the electronic device, at least one of the first rotating shaft 430 and the second rotating shaft 440 drives the rack 460 and the pushing part 461 to slide along the guiding surface 511 via the second gear 441, and drive the sliding member 510 to move along the axis of the first rotating shaft 430. For example, the pushing part 461 may be a protrusion disposed on the rack 460. In some embodiments, the pushing part 461 is a spherical protrusion disposed on the rack 460, to reduce resistance when the pushing part 461 slides along the guiding surface 511. The pushing part 461 may be an inclined surface disposed on the rack 460.

In an embodiment, the first rotating shaft 430 is disposed with the second gear 441. The second gear 441 on the first rotating shaft 430 is engaged with the rack 460 for transmission. In some embodiments, in a process in which the first device body 100 and the second device body 200 rotate the first device body 100 drives the first rotating shaft 430 to rotate, so that the second gear 441 on the first rotating shaft 430 may drive the rack 460 to move, and the pushing part 461 slides along the guiding surface 511. In some alternative embodiments, the second rotating shaft 440 is disposed with the second gear 441, and the second gear 441 on the second rotating shaft 440 is engaged with the rack 460 for transmission, to drive the rack 460 to move via the second rotating shaft 400, and drive the sliding member 510 to move in the axial direction of the shaft component 400.

Referring to FIG. 5 and FIG. 7. The first rotating shaft 430 and the second rotating shaft 440 are both disposed with the second gears 441. The rack 460 is disposed between the first rotating shaft 430, and the second rotating shaft 440, and tooth structures are provided on both sides of the rack 460. The rack 460 is separately engaged with the second gear 441 on the first rotating shaft 430 and the second gear 441 on the second rotating shaft 440. In this embodiment, forces on both sides of the rack 460 may be balanced, to prevent the rack 460 from being stuck in a transmission process.

In an embodiment, the rack 460 may be slidably matched with the bracket 450. In some embodiments, the bracket 450 is provided with a sliding slot. The rack 460 is at least partially located in the sliding slot, and the rack 460 may slide along the sliding slot.

Referring to FIG. 2 to FIG. 5. The connecting rod mechanism 500 further includes a third connecting rod 560. One end of the third connecting rod 560 is connected to the second device body 200, and a second end of the third connecting rod 560 is connected to the sliding member 510. For example, in the folding process of the electronic device, the shaft component 400 drives the first device body 100 to approach the shaft component 400 via the first connecting rod 520, and drives the second device body 200 to approach the shaft component 400 via the third connecting rod 560. In the unfolding process of the electronic device, the shaft component 400 drives the first device body 100 to move away from the shaft component 400 via the first connecting rod 520, and drives the second device body 200 to move away from the shaft component 400 via the third connecting rod 560.

For example, a connection manner between the third connecting rod 560 and the sliding member 510 may be the same as the connection manner between the first connecting rod 520 and the sliding member 510. Therefore, this specification does not further describe a specific connection manner between the third connecting rod 560 and the sliding member 510. Similarly, a connection manner between the third connecting rod 560 and the second device body 200 may be the same as a connection manner between the first connecting rod 520 and the first device body 100. Therefore, this specification does not further describe a specific connection manner between the third connecting rod 560 and the second device body 200.

Referring to FIG. 2 to FIG. 5. In an embodiment, the connecting rod mechanism 500 further includes a fourth connecting rod 570. Further, a connection manner between the fourth connecting rod 570 and the sliding member 510 may be the same as a connection manner between the second connecting rod 540 and the sliding member 510. Therefore, this specification does not further describe a specific connection manner between the fourth connecting rod 570 and the sliding member 510. Further, a connection manner between the fourth connecting rod 570 and the third connecting rod 560 may be the same as a connection manner between the second connecting rod 540 and the first connecting rod 520. Therefore, this specification does not further describe the connection manner between the fourth connecting rod 570 and the third connecting rod 560.

Referring to FIG. 2 to FIG. 4. In an embodiment, there is one sliding member 510 of the connecting rod mechanism 500, that is, the first connecting rod 520 and the third connecting rod 560 of the connecting rod mechanism 500 are connected to the same sliding member 510. Further, the first connecting rod 520 and the third connecting rod 560 are symmetrically disposed on both sides of the shaft component 400. The second connecting rod 540 and the fourth connecting rod 570 are symmetrically disposed on both sides of the shaft component 400.

In the foregoing embodiment, when the rotation angle of the first device body 100 relative to the shaft component 400 is equal to the rotation angle of the second device body 200 relative to the shaft component 400, a distance in which the first device body 100 is close to or away from the shaft component 400 is equal to a distance in which the second device body 200 is close to or away from the shaft component 400, that is, the first device body 100 and the second device body 200 rotate synchronously relative to the shaft component 400. In this way, mutual friction between the third display screen 330 and the support plate may be effectively avoided, to protect the third display screen 330.

There may be two sliding members 510 of the connecting rod mechanism 500, and the first connecting rod 520 and the third connecting rod 560 of the connecting rod mechanism 500 are respectively connected to the two different sliding members 510.

In an embodiment, the second connecting member 420 is connected to the second rotating shaft 440, and the second connecting member 420 may drive the second rotating shaft 440 to rotate. The second device body 200 is slidably matched with the second connecting member 420, and the second device body 200 may move in a radial direction of the second rotating shaft 440 relative to the second connecting member 420. A connection manner between the second connecting member 420 and the second rotating shaft 440 may be the same as a connection manner between the first connecting member 410 and the first rotating shaft 430. Therefore, this specification does not further describe the connection manner between the second connecting member 420 and the second rotating shaft 440.

Further, in an embodiment, the first axis around which the first connecting rod 520 rotates relative to the sliding member 510 is parallel with or overlaps the first rotating shaft 430. An axis around which the third connecting rod 560 rotates relative to the sliding member 510 may be parallel with or overlap the axis of the second rotating shaft 440.

The electronic device disclosed in this embodiment of this application may be a mobile phone, a watch, a vehicle-mounted display, a tablet computer, an e-book reader, a medical instrument, and the like. A specific type of the electronic device is not limited in this embodiment of this application.

It should be noted that, in this specification, the term "include", "comprise", or any other variant thereof is intended to cover a non-exclusive inclusion, so that a process, a method, an article, or an apparatus that includes a list of elements not only includes those elements but also includes other elements which are not expressly listed, or further includes elements inherent to this process, method, article, or apparatus. In absence of more constraints, an element preceded by "includes a . . . " does not preclude the existence of other identical elements in the process, method, article, or apparatus that includes the element. In addition, it should be noted that the scope of the method and the apparatus in the implementations of this application is not limited to performing functions in an illustrated or discussed sequence, and may further include performing functions in a basically simultaneous manner or in a reverse sequence according to the functions concerned. For example, the described method may be performed in an order different from that described, and the steps may be added, omitted, or combined. In addition, features described with reference to some examples may be combined in other examples.

The embodiments of this application are described above with reference to the accompanying drawings, but this application is not limited to the foregoing implementations, and the foregoing implementations are only illustrative and not restrictive. Under the enlightenment of this application, a person of ordinary skill in the art can make many forms without departing from the purpose of this application and the protection scope of the claims, all of which fall within the protection of this application.

The invention claimed is:

1. An electronic device, comprising a first device body; a second device body; a flexible display screen; a shaft component; and a connecting rod mechanism, wherein:

the first device body is rotatably connected to the second device body via the shaft component, the connecting rod mechanism is connected to the first device body and the shaft component, respectively, the flexible display screen comprises a first display screen, a second display screen, and a third display screen, wherein the first display screen is provided on the first device body, the second display screen is provided on the second device body, and the first display screen is connected to the second display screen via the third display screen, in a folding process of the electronic device, the shaft component drives the first device body to approach the shaft component via the connecting rod mechanism, in an unfolding process of the electronic device, the shaft component drives the first device body to move away from the shaft component via the connecting rod mechanism, and the shaft component comprises: a first connecting member, a first rotating shaft, and a second rotating shaft, wherein:

the first rotating shaft and the second rotating shaft are disposed in parallel, the first connecting member is connected to the first rotating shaft, the first connecting member drives the first rotating shaft to rotate, the first device body is slidably matched with the first connecting member, and the first device body approaches or moves away from the first rotating shaft along the first connecting member, and the second device body is connected to the second rotating shaft.

2. The electronic device according to claim 1, wherein the connecting rod mechanism comprises a sliding member and a first connecting rod, wherein:

the sliding member is connected to the shaft component, a first end of the first connecting rod is connected to the sliding member, and a second end of the first connecting rod is connected to the first device body, in the folding process of the electronic device, the shaft component drives the sliding member to move along the shaft component, and the sliding member drives the first device body to approach the shaft component via the first connecting rod, and in the unfolding process of the electronic device, the shaft component drives the sliding member to move along the shaft component, and the sliding member drives the first device body to move away from the shaft component via the first connecting rod.

3. The electronic device according to claim 2, wherein:

a first end of the first connecting rod is rotatably matched with the sliding member, the first connecting rod rotates around a first axis and a second axis relative to the sliding member, the first axis is parallel with or overlaps an axis of the first rotating shaft, and the second axis is perpendicular to the first axis, and a second end of the first connecting rod is rotatably connected to the first device body.

4. The electronic device according to claim 3, wherein:

the connecting rod mechanism further comprises a first hinge joint, the first hinge joint is rotatably matched with the sliding member, and the first hinge joint rotates around the first axis relative to the sliding member, and the first end of the first connecting rod is rotatably matched with the first hinge joint, and the first connecting rod rotates around the second axis relative to the first hinge joint.

5. The electronic device according to claim 2, wherein:

the connecting rod mechanism further comprises a third connecting rod, one end of the third connecting rod is connected to the second device body, and a second end of the third connecting rod is connected to the sliding member, in the folding process of the electronic device, the shaft component drives the first device body to approach the shaft component via the first connecting rod, and drives the second device body to approach the shaft component via the third connecting rod, and in the unfolding process of the electronic device, the shaft component drives the first device body to move away from the shaft component via the first connecting rod, and drives the second device body to move away from the shaft component via the third connecting rod.

6. The electronic device according to claim 1, wherein:

the shaft component further comprises a second connecting member, and the second device body is connected to the second rotating shaft via the second connecting member, and the first connecting member and the second connecting member are both disposed with first gears, and the first gear on the first connecting member is engaged with the first gear on the second connecting member.

7. The electronic device according to claim 1, wherein the shaft component further comprises a bracket, wherein:

the bracket is provided with a first mounting hole and a second mounting hole, the first rotating shaft is rotatably matched with the first mounting hole, and the second rotating shaft is rotatably matched with the second mounting hole.

8. The electronic device according to claim 7, wherein the shaft component further comprises a support plate, wherein the support plate is disposed on a side of the support close to the flexible display screen, and an arc-shaped support surface is provided on a side of the support plate close to the flexible display screen.

9. The electronic device according to claim 7, wherein:

the connecting rod mechanism further comprises a second connecting rod, a first end of the second connecting rod is rotatably matched with the bracket, the second connecting rod rotates around a third axis and a fourth axis relative to the bracket, the third axis is parallel with or overlaps an axis of the first rotating shaft, and the fourth axis is perpendicular to the third axis, and a second end of the second connecting rod is rotatably connected to the first connecting rod, and a connection point between the second connecting rod and the first connecting rod is located between the first end and the second end of the first connecting rod.

10. The electronic device according to claim 9, wherein:

the connecting rod mechanism further comprises a second hinge joint, the second hinge joint is rotatably matched with the bracket, and the second hinge joint rotates around the third axis relative to the bracket, and the first end of the second connecting rod is rotatably matched with the second hinge joint, and the second connecting rod rotates around the fourth axis relative to the second hinge joint.

11. The electronic device according to claim 1, wherein:

at least one of the first rotating shaft and the second rotating shaft is provided with a threaded section, the sliding member is provided with a threaded hole, and the threaded section is threadedly matched with the threaded hole, or the shaft component further comprises a rack, and at least one of the first rotating shaft and the second rotating shaft is disposed with a second gear, wherein:

one of the rack and the sliding member is disposed with a pushing part, the other one of the rack and the sliding member is provided with a guiding surface, the guiding surface is provided in an inclined manner relative to an axial direction of the first rotating shaft, and the pushing part abuts against the guiding surface, wherein in the folding process of the electronic device, at least one of the first rotating shaft and the second rotating shaft drives the rack and the pushing part to slide along the guiding surface via the second gear, and drives the sliding member to move along the axis of the first rotating shaft.

* * * * *